(12) United States Patent
Toprac (10) Patent No.: US 6,532,428 B1
(45) Date of Patent: Mar. 11, 2003

(54) METHOD AND APPARATUS FOR AUTOMATIC CALIBRATION OF CRITICAL DIMENSION METROLOGY TOOL

(75) Inventor: Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/414,190

(22) Filed: Oct. 7, 1999

(51) Int. Cl.[7] .............................................. G01B 11/00
(52) U.S. Cl. ........................ 702/97; 702/85; 702/108; 702/118; 702/127; 702/170; 702/183
(58) Field of Search ................................ 702/35, 36, 38, 702/40, 58, 59, 81–84, 85, 94, 95, 97, 108, 117, 118, 127, 152, 155, 159, 170–172, 179, 183, 185, FOR 103, FOR 104, FOR 123–125, FOR 134, FOR 137, FOR 139, FOR 148, FOR 156–163, FOR 170, FOR 171; 700/121, 110; 438/5, 8, 14, 16, 17; 365/399–401, 123–127, 373, 372, 375, 374; 355/43, 53; 250/559, 3, 548

(56) References Cited

U.S. PATENT DOCUMENTS

| | | | | |
|---|---|---|---|---|
| 4,796,038 A | * | 1/1989 | Allen et al. ..................... 354/4 |
| 5,655,110 A | * | 8/1997 | Krivokapic et al. ......... 395/500 |
| 5,690,785 A | * | 11/1997 | Nakaya ..................... 156/626.1 |
| 5,701,013 A | * | 12/1997 | Hsia et al. ................. 250/491.1 |
| 5,757,507 A | * | 5/1998 | Ausschnitt et al. ......... 356/401 |
| 5,798,529 A | * | 8/1998 | Wagner ..................... 250/492.2 |
| 5,851,842 A | * | 12/1998 | Katsumata et al. ............. 438/9 |
| 5,866,437 A | * | 2/1999 | Chen et al. ..................... 438/14 |
| 5,926,690 A | * | 7/1999 | Toprac et al. .................. 438/17 |
| 5,956,566 A | * | 9/1999 | Lin et al. ........................ 438/17 |
| 6,041,270 A | * | 3/2000 | Steffan et al. ............... 700/121 |
| 6,049,660 A | * | 4/2000 | Ahn et al. ............. 395/500.34 |
| 6,063,531 A | * | 5/2000 | Singh et al. .................. 430/30 |
| 6,084,816 A | * | 7/2000 | Okamura ............... 365/230.03 |
| 6,098,024 A | * | 8/2000 | Chen et al. .................... 702/81 |
| 6,128,089 A | * | 10/2000 | Ausschnitt et al. ......... 356/401 |
| 6,130,750 A | * | 10/2000 | Ausschnitt et al. ......... 356/401 |
| 6,154,711 A | * | 11/2000 | Steffan et al. ................. 702/82 |
| 6,225,639 B1 | * | 5/2001 | Adams et al. ............ 250/559.4 |
| 6,245,581 B1 | * | 6/2001 | Bonser et al. .................. 438/8 |
| 6,268,226 B1 | * | 7/2001 | Angell et al. ................. 438/16 |
| 6,278,114 B1 | * | 8/2001 | Mitsui ......................... 250/310 |
| 6,298,470 B1 | * | 10/2001 | Breiner et al. .................. 716/4 |
| 6,304,836 B1 | * | 10/2001 | Krivokapic et al. .......... 703/14 |
| 7,317,211 | * | 11/2001 | Ausschnitt et al. ......... 356/401 |

FOREIGN PATENT DOCUMENTS

WO    WO 01/22183 A1  *  3/2001

* cited by examiner

Primary Examiner—Marc S. Hoff
Assistant Examiner—Carol S. Tsai
(74) Attorney, Agent, or Firm—Williams, Morgan & Amerson, P.C.

(57) ABSTRACT

The present invention provides for a method and an apparatus for performing automatic calibration of a critical dimension metrology. A process run of semiconductor devices is performed. Critical dimension measurements are performed upon at least one the processed semiconductor device. A calibration adjustment procedure is performed using the critical dimension measurements.

41 Claims, 7 Drawing Sheets

METHOD AND APPARATUS FOR AUTOMATIC CALIBRATION OF CRITICAL DIMENSION METROLOGY TOOL

BACKGROUND OF THE INVENTION

1. Field of the Invention

This invention relates generally to semiconductor products manufacturing, and, more particularly, to a method and apparatus for performing automatic calibration of critical dimension metrology tool.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical planarization (CMP) control, etching, and overlay control. Overlay is one of several important steps in the photolithography area of semiconductor manufacturing. Overlay process involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month. The results from the analysis of the overlay errors are used to make updates to exposure tool settings manually. Generally, a manufacturing model is employed to control the manufacturing processes. Some of the problems associated with the current methods include the fact that the exposure tool settings are only updated a few times a month. Furthermore, currently the exposure tool updates are performed manually. Many times, errors in semiconductor manufacturing are not organized and reported to quality control personal. Often, the manufacturing models themselves incur bias errors that could compromise manufacturing quality. Calibration of tools that measure critical dimensions is important in developing semiconductor devices with polysilicon gates with consistent critical dimensions.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. These errors can cause appreciable inconsistencies in the critical dimensions of multiple parameters in the processed semiconductor devices. Furthermore, it is important to accurately measure critical dimensions of the parameters of the processed semiconductor device. Fine tuning the performance of tools that measure critical dimensions of semiconductor devices is important in obtaining accurate manufacturing data, which is used to determine multiple settings of subsequent manufacturing processes.

The present invention is directed to overcoming, or at least reducing the effects of, one or more of the problems set forth above.

SUMMARY OF THE INVENTION

In one aspect of the present invention, a method is provided for performing automatic calibration of a critical dimension metrology. A process run of semiconductor devices is performed. Critical dimension measurements are performed upon at least one of the processed semiconductor devices. A calibration adjustment procedure is performed using the critical dimension measurements.

In another aspect of the present invention, an apparatus is provided performing automatic calibration of a critical dimension metrology. The apparatus of the present invention comprises: a first processing tool capable of processing at least one semiconductor wafer; a first metrology tool interfaced with the first processing tool, the first metrology tool being capable of acquiring production data from the processed semiconductor wafer; and a calibration algorithm unit interfaced with the first metrology tool, the calibration algorithm unit being capable of calibrating the first metrology tool in response to the production data.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, and/or manufacturing data is generated. The production data can be used to perform fault detection analysis that can lead to improved manufacturing results. Overlay process is a group of process steps in semiconductor manufacturing. In particular, critical dimension measurements are made after manufacturing processes such as photolithography and photo-resist etching processes are performed. The critical dimension data can be used to make adjustments to manufacturing processes for subsequent manufacturing runs of semiconductor devices, such as semiconductor wafers. Proper measurement of critical dimensions in the semiconductor wafers is used to in make adjustments to subsequent manufacturing processes. Reducing errors during critical dimension measurements can be accomplished by performing accurately calibrating the tools that perform measurements of critical dimensions in semiconductor wafers. The present invention provides for a method and apparatus for performing automated calibration of critical dimension measurement tools.

One significant portion of manufacturing data, or production data, is critical dimension measurements. Proper calibration of manufacturing tools that perform measurement of critical dimensions of portions of a processed semiconductor wafer, such as polysilicon gate structures, is useful in acquiring accurate production data. Control of polysilicon gate critical dimensions affects the production quality of semiconductor products, such as microprocessors, memory, and the like. In many cases, the critical dimensions correlate directly to the performance of semiconductor devices. For example, the critical dimension of a semiconductor device affects the speed and/or the functionality of the semiconductor device. As a result, excessive variation in critical dimension control can result in unacceptably slow semiconductor devices, costly fast parts, and a large number of high leakage products.

However, performing near optimal process control to achieve acceptable critical dimension values is a complex task, primarily due to continual drift and step changes that occur in the photolithography and etching tools. A process controller (not shown), such as an automatic process control (APC) system, utilizes critical dimension measurements to make adjustments to manufacturing processes that result in more consistent critical dimensions in the semiconductor devices. The accuracy of the critical dimension measurements is useful in performing effective control of critical dimension values. One of the critical dimension measurements involves measuring the width of a polysilicon line in a semiconductor wafer that is being processed.

One step in performing proper control of critical dimensions is keeping track of the shifts and other changes in the performance of the tool that measures the critical dimensions in a semiconductor wafer. If a critical dimension measurement tool begins to measure incorrectly, a bias can be introduced into the measurement. In this case, the relationship of the critical dimension measurement of a polysilicon line to the effective width of the polysilicon line can become corrupted. The correlation between the critical dimension measurement of the polysilicon line and the effective width of the polysilicon line can erroneously shift. The present invention provides for a method and an apparatus for correcting the shift in the aforementioned correlation of the polysilicon line and updating this relationship using external factors.

Correcting the shift in the correlation of the polysilicon line can be performed by properly calibrating the tools that measure critical dimensions in semiconductor wafers. The external factors that can be used to perform calibration of critical measurement tools include performing highly accurate critical measurement data, such as data from Atomic Force Microscope (AFM), in-line electrical tests on a non-production semiconductor wafer, and wafer electrical tests on production semiconductor wafers. One of the factors that affects the accuracy of critical dimension measurements is the proper calibration of tools that perform critical dimension measurements.

Figure 1:
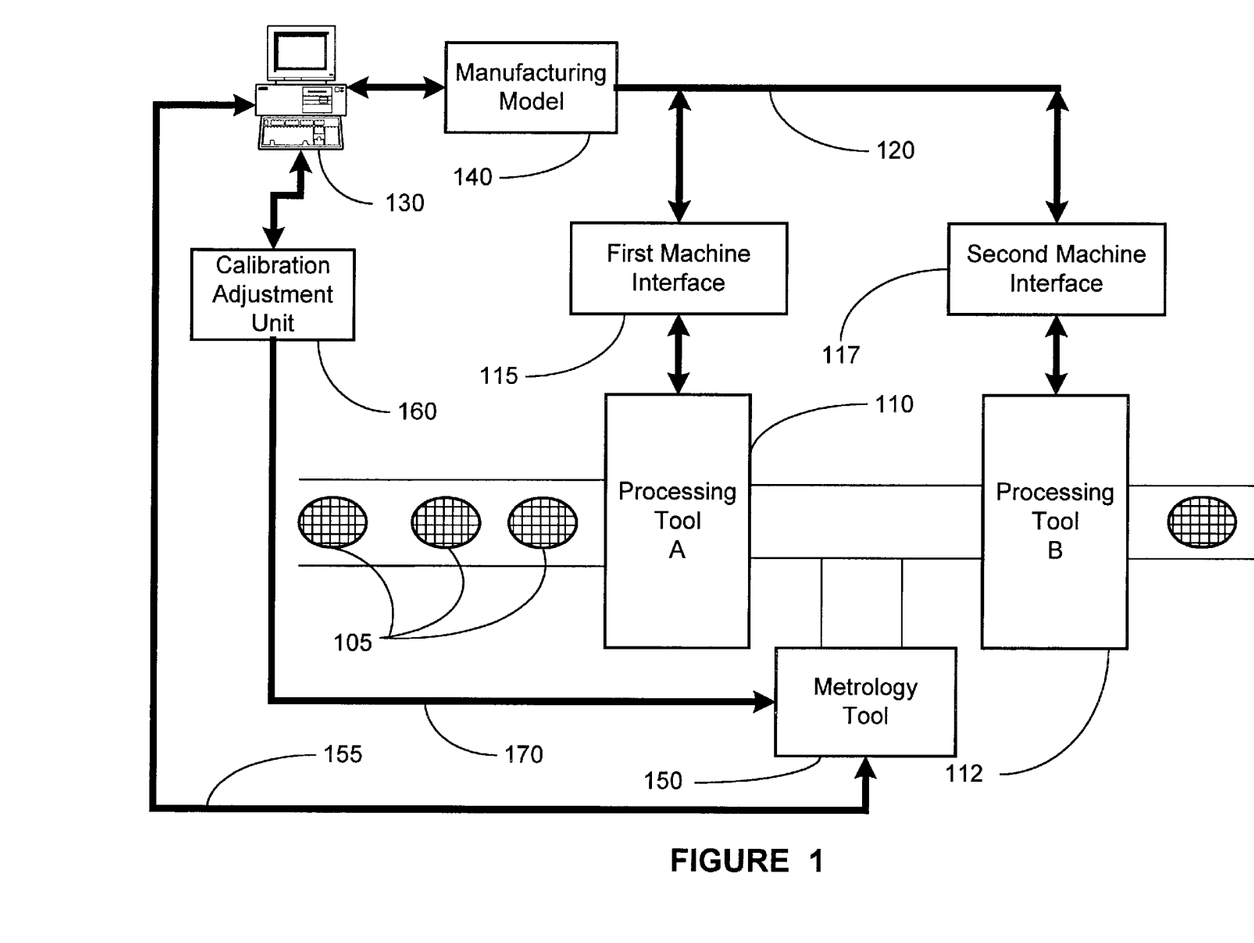
FIG. 1 illustrates one embodiment of the present invention.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers.

For processing tools such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

A metrology tool 150, such as a critical dimension measurement tool, is employed in the semiconductor device manufacturing system illustrated in FIG. 1. In one embodiment, the metrology tool 150 is capable of performing critical dimension measurements on semiconductor products 105 that are processed by the processing tools 110, 112. In one embodiment, data from the metrology tool 150 is sent, on a line 155, to the computer system 130, which in one embodiment is part of a process control system (not shown), such as an APC system. In one embodiment, the computer system 130 sends data to a calibration adjustment unit 160. The calibration adjustment unit 160 sends calibration adjustment data on a line 170 to the metrology tool 150, which then performs calibration adjustments for the next set of data acquisition to be performed.

Figure 2:
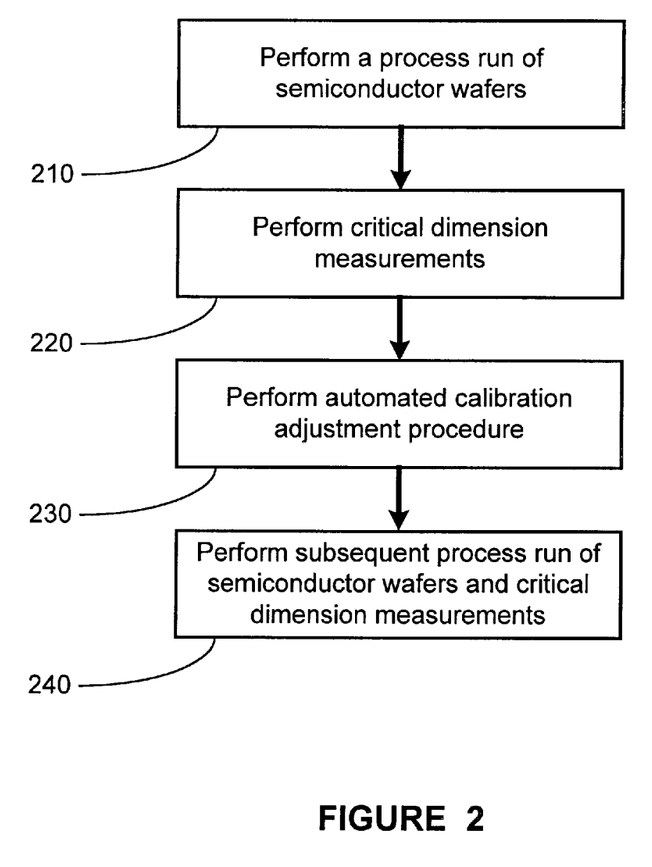
FIG. 2 illustrates a flowchart representation of one method of performing automated calibration of measurement tools, as taught by the present invention.

Turning now to FIG. 2, a flowchart representation of one method of performing automated calibration of measurement tools, as taught by the present invention, is illustrated. A manufacturing process run of semiconductor devices, such as semiconductor wafers, is performed, as described in block 210 of FIG. 2. A set of critical dimensions are measured on the processed semiconductor devices, as described in block 220 of FIG. 2. In one embodiment, the critical dimension measurement is performed using a metrology tool 150, such as a primary critical dimension (CD) metrology tool.

Figure 3:
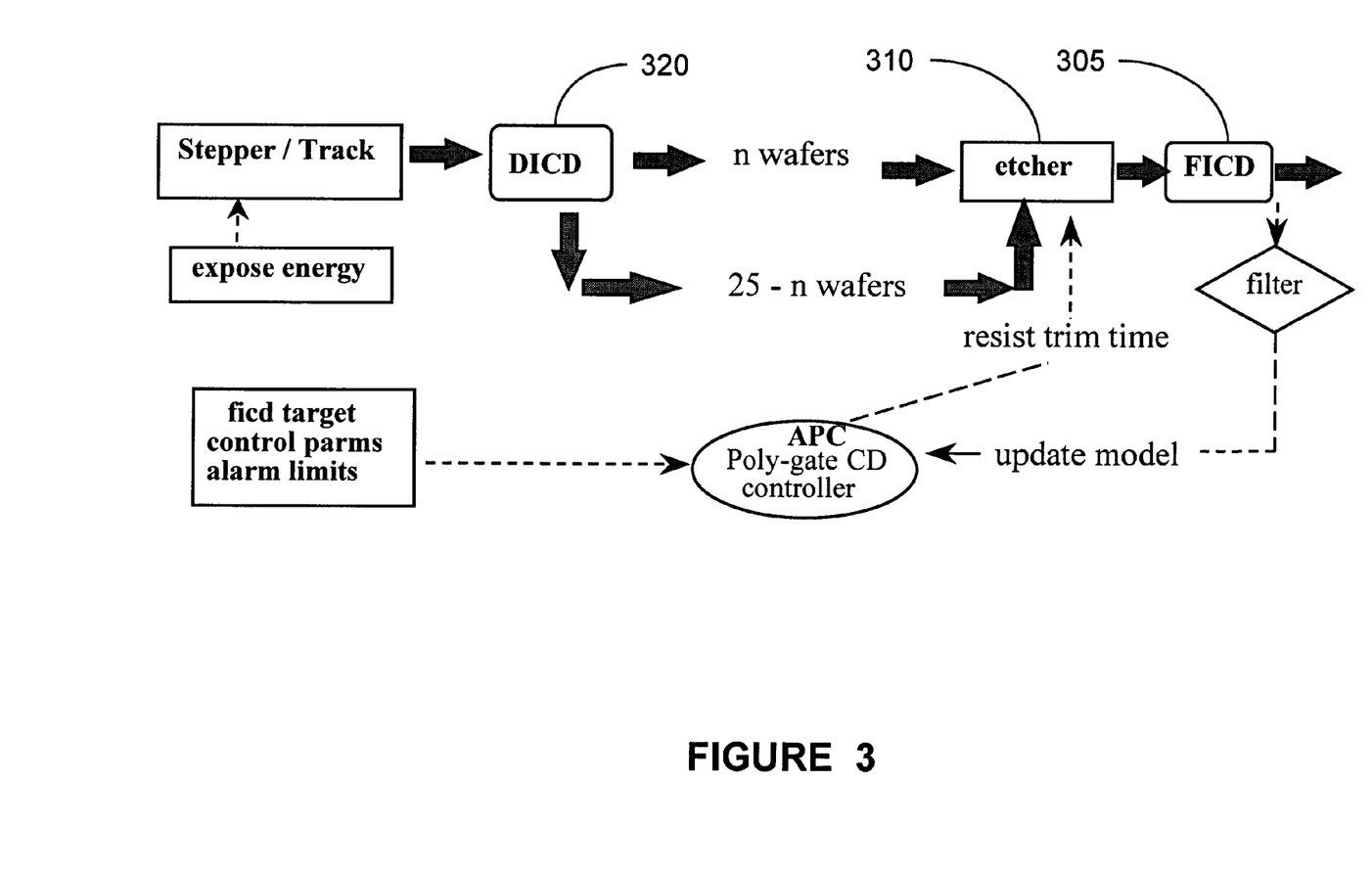
FIG. 3 illustrates one embodiment of a schematic of a polysilicon critical dimension controller.

One embodiment of the control strategy of performing polysilicon gate (poly-gate) CD measurement for a photoresist etcher process is as follows. The control strategy for poly-gate CD's is illustrated in FIG. 3. The control "knob" that has been developed is an additional etch step before the standard poly-gate etch is run. This additional step is an etch of photoresist, with the result that the photoresist line width is reduced. Increasing or decreasing resist etch time results in larger or smaller final inspection critical dimensions (FICDs 305). Since FICDs 305 can only be reduced by this method, incoming wafers must have larger than nominal DICDs 320. A reduction of current nominal photo-exposure places the normal range of poly CD variation above the target value. A sample set of "n" wafers is taken from the lot and sent ahead through the etcher 310. These send-ahead wafers receive a nominal photoresist etch time resulting from a characteristic resist trim time seen in previously processed lots. The sample wafers are stripped and the FICDs 305 are measured. A process controller, such as an APC controller automatically reads these FICD 305 measurements. The process controller filters this data to reduce noise and determines the correct photoresist trim time to drive the remaining wafers in the lot to the FICD 305 target. The recipe is downloaded, the trim time is automatically adjusted, and the balance of the lot is etched at the new trim time. The process controller also determines whether or not send-ahead wafers from subsequent lots are required. With no send-ahead sample, the process controller uses the FICD 305 measurements from previously etched lots to update resist trim time.

The advantage of this control method is improved lot-average FICD 305 control, quantified below. In addition, manufacturability is improved because variations at both photo (e.g., track PM's) and etch (e.g., wet chamber cleans) are now automatically compensated by photoresist trim time, in contrast to the previous engineering-intensive control method of photolithography rework at a modified exposure dose.

The control algorithm is outlined here as it would apply to a series of lots of the same context, or "thread", arriving at poly-gate etch to be processed in the same chamber. The context for the lots includes product type as well as "quarantine" tags produced by step change events, such as maintenance actions, in photolithography.

The control model defines the relationship between the control variable, a conditioned FICD 305 (FICD_bar) measurement, and the manipulated variable of photoresist etch time. This relationship is defined by a polynomial function (see Equation 1), $$FICD\_bar = c - a*t^2 - b*t, \qquad \text{Equation 1}$$

where a and b are model parameters determined from experimental data and are part of the formal specification for this process. This formal specification is versioned and requires approval to change. These constants reside in the Recipe Management System (RMS), along with the process recipes and other parameters of the process specification. The variable t is the photoresist etch time, and c is a parameter that is adapted to the current state of the etch process.

At initialization, the process controller output is a fixed "default" value for resist etch time, $t_0$. This value resides in RMS along with the initial value of c and the FICD 305 target in accordance with the model equation (see Equation 2):

$$FICD\_target = c_0 - a*t_0^2 - b*t_0 \qquad \text{Equation 2}$$

The initialization condition is termed a "Reset," a condition that may be invoked by operator entry or by automatic action. A Reset condition requires a send-ahead child lot of one or more sample wafers to be run at initial time $t_0$. No additional lots can be run before the FICDs 305 are measured for the initial child lot.

The FICD 305 data is conditioned to produce FICD_bar as described in the Measurement Estimation Algorithm section given below. The model is adapted to present operation by modifying the parameter c (see Equation 3):

$$c_1 = FICD\_bar - a*t_0^2 - b*t_0 \qquad \text{Equation 3}$$

The predicted time $t_1$ for the parent lot is determined by minimizing an error function given by Equation 4, $$error = (FICD\_target - FICD\_predicted)^2 \qquad \text{Equation 4}$$

over the discrete set of feasible resist etch times as determined by RMS values of tmin and tmax (see Equation 5), $$t = [tmin, tmin+1, tmin+2, \ldots tmax]. \qquad \text{Equation 5}$$

FICD_predicted is defined by the model equation over the set of times t, using the updated parameter $c_1$ (Equation 6):

$$FICD\_predicted = c_1 - a*t^2 - b*t \qquad \text{Equation 6}$$

The parent lot is etched with resist etch time $t_1$, the resulting FICD_bar values are measured, the parameter c is updated, and a new etch time is produced for the next lot, with continuation of this iterative loop ad infinitum.

In one embodiment, FICDs 305 are measured by a critical dimension measuring tool known as Opal, at nine sites across the wafer. For a given context of product type, etch chamber, and quarantine tags, these FICD 305 measurements are conditioned to improve the estimation of true FICD 305 values.

In one embodiment, each set of 9 measurements is examined for "outliers" by determining if any of the individual measurements lie outside a "normal" range of variation. This normal range can be determined by several different methods, with slightly varying results. In one embodiment, the "Box plot" method is used. In addition to outliers, zero values are discarded. The number of remaining measurements must be greater than an RMS value of min_good_measures. If remaining measurements are too few, an exception condition is generated. The median and standard deviation values from individual wafer data are determined. These values are compared to bounds for the median values and a maximum allowed value for the standard deviation. An exception condition is generated for values outside of these RMS-specified values. Similar bounds checking is performed for the average and range of the median FICD 305 values from each wafer of the sample set.

The resulting single value is FICD_avg, the average of wafer median FICD 305 measurements that characterize this lot of wafers. FICD_avg is now Exponentially-Weighted Moving Average (EWMA) filtered against the current EWMA average based on parent lot measurements (Equation 7):

$$FICD\_bar_{n+1} = lambda*FICD\_avg + (1-lambda)*FICD\_bar_n, \qquad \text{Equation 7}$$

where lambda is a RMS specified value. This value, with the context of product type, etc., is sent to a process controller (not shown) to be used to determine photoresist etch time for the lot.

Using the methods described above, the critical dimension measurements of processed semiconductor devices are performed. Once the critical dimension measurement described in block 220 is substantially complete, an automated calibration adjustment procedure is performed, as described in block 230 of FIG. 2. A more detailed description of the automated calibration adjustment procedure described in block 230, is illustrated in FIG. 4.

Figure 4:
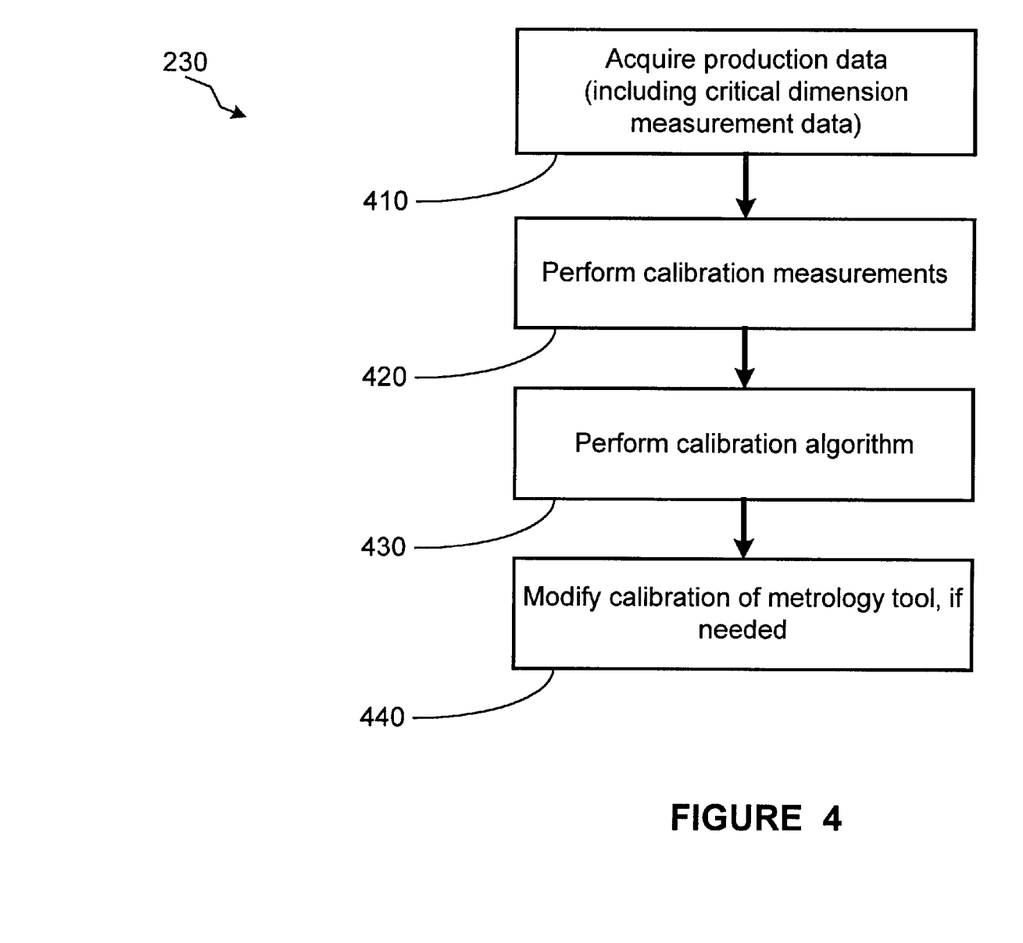
FIG. 4 illustrates a flowchart representation of a more detailed depiction of the method of performing the automated calibration adjustment procedure described in FIG. 2.

Turning now to FIG. 4, production data that includes critical dimension measurement data is acquired, as described in block 410 of FIG. 4. Once critical dimension measurement data is acquired, calibration measurement for a particular metrology tool 150 is performed, as described in block 420. Calibration measurement methods may vary from one metrology tool 150 to another and are known by those skilled in the art having the benefit of the present disclosure. When the calibration measurements are completed, a calibration algorithm is performed to calculate the proper amount of calibration that is needed for a metrology tool to function properly, as described in block 430 of FIG. 4. In one embodiment, the calibration algorithm is a computer program that calculates a calibration modification value based on calibration measurements. The calibration algorithm may vary from one metrology tool 150 to another and can be executed by those skilled in the art and having the benefit of the present disclosure.

When the calibration algorithm described in block 430 is substantially complete, the calibration modification value is used to modify the calibration of a metrology tool 150 such that measurement errors, such as measurement bias, are substantially reduced, as described in block 440 of FIG. 4. In one embodiment, the processes of acquiring production data, performing calibration measurements, performing the calibration algorithm, and modifying the calibration of the metrology tool 150 are performed automatically by a process controller, such as an APC system. When the calibration of the metrology tool 150 is complete, the automated calibration adjustment procedure described in block 230 of FIG. 2 is completed. Turning now to FIG. 2, once the automated calibration adjustment procedure is complete, subsequent manufacturing runs of semiconductor wafers are performed and new critical dimension measurements are performed, as described in block 240 of FIG. 2. In one embodiment, the process described in FIG. 2 is then repeated. In an alternative embodiment, the automated calibration adjustment procedure is executed every Nth manufacturing run of production, or performed asynchronous to manufacturing run based on a predetermined specified interval. In one embodiment the predetermined specified interval is one day.

Figure 5:
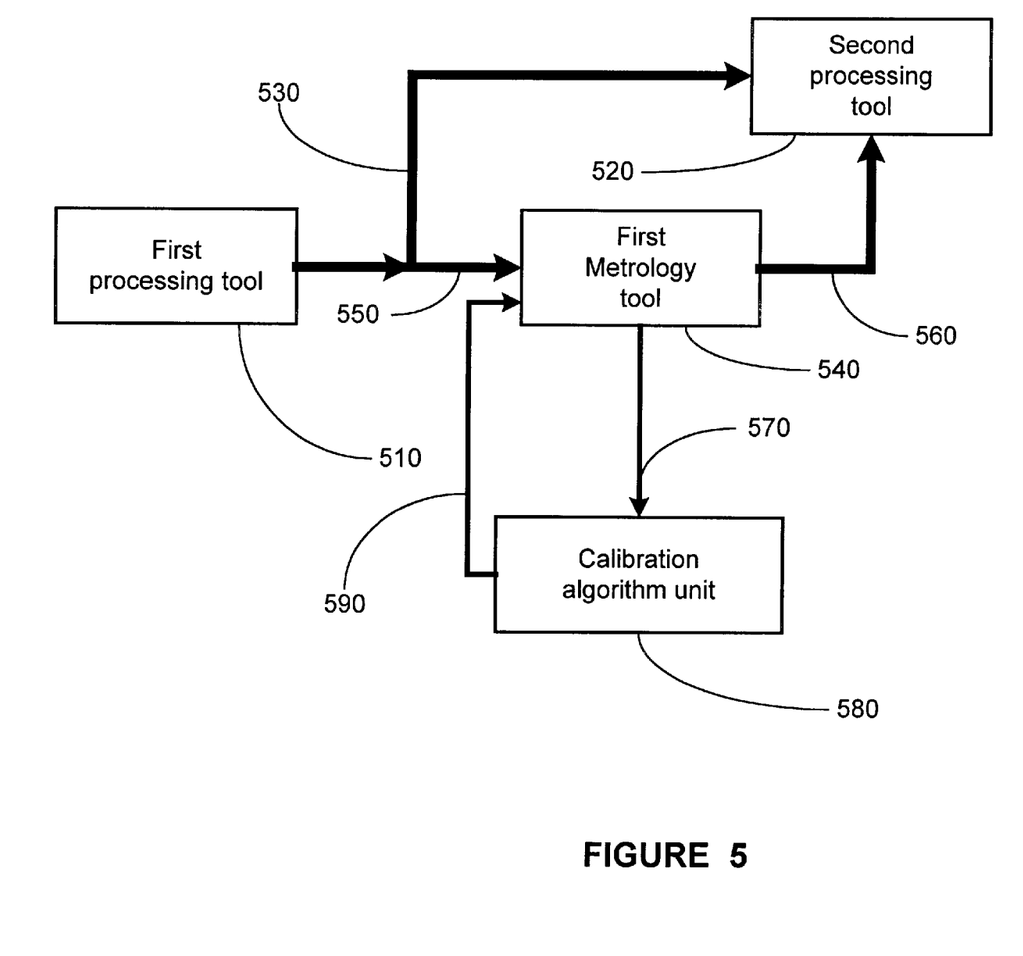
FIG. 5 illustrates a block diagram representation of a first embodiment of an apparatus for performing automated calibration of measurement tools, as taught by the present invention.

One embodiment of an apparatus provided for performing the methods taught by the present invention is illustrated in FIG. 5. Turning now to FIG. 5, a first processing tool 510 is interfaced with a second processing tool 520. Semiconductor wafers are transported from the first processing tool 510 to the second processing tool 520 on a transport line represented by a line 530. A significant percentage of the semiconductor wafers processed by the first processing tool 510 are transported to the second processing tool 520 for further processing. A predetermined percentage of semiconductor wafers that are processed in the first processing tool 510 are sent to a first metrology tool 540, via a transport line represented by a line 550. Once metrology measurements are completed, the sample processed semiconductor wafers are then routed to the second processing tool 520 on a line 560 for further processing.

In one embodiment, the first metrology tool 540 is a critical dimension measurement tool. Critical dimension measurements are performed by the first metrology tool 540 and the resulting measurement data is then sent to the calibration algorithm unit 580 via a line 570. In one embodiment, the calibration algorithm unit 580 is a computer program and is incorporated into the computer system 130. The calibration algorithm unit 580 performs the automated calibration method described in FIG. 2. The calibration modification data calculated by the calibration algorithm unit 580 is sent to the first metrology tool 540 for further calibration of the first metrology tool 540. In one embodiment, the multiple data transfers described by FIG. 5 are controlled by a process controller such as an APC system.

Figure 6:
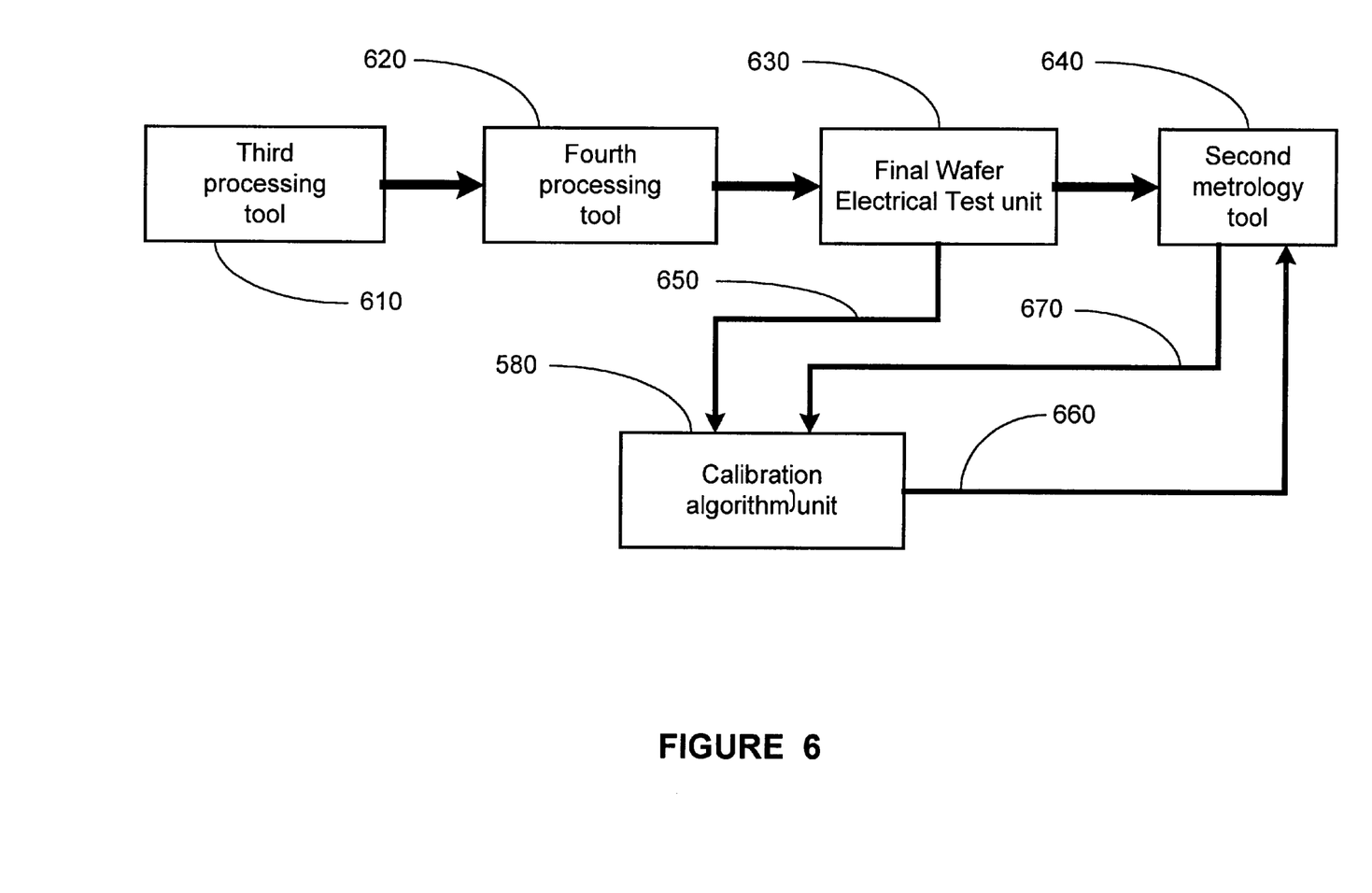
FIG. 6 illustrates a block diagram representation of a second embodiment of an apparatus for performing automated calibration of measurement tools, as taught by the present invention.

An alternative embodiment of an apparatus for performing the methods taught by the present invention is illustrated in FIG. 6. Turning now to FIG. 6, a third processing tool 610 processes a manufacturing run of semiconductor wafers. The processed semiconductor wafers are then further processed by a fourth processing tool 620. The processed semiconductor wafers are then sent to a final wafer electrical test (WET) unit 630 for electrical testing. In one embodiment, a short loop wafer, or a non-production wafer, is sent to the final wafer electrical test unit 630. In one embodiment, the electrical testing that is performed includes measuring the electrical resistance corresponding to a polysilicon line in the semiconductor wafers, and other characteristics of the polysilicon line such as cross-dimensional measurements of the polysilicon line. In one embodiment, if the electrical resistance associated with a polysilicon line does not properly correlate with other metrology measurements of the polysilicon line, such as made by the second metrology tool 640 and sent to the calibration algorithm unit 580 via a data channel on the line 670, data that describes the degree of amount of the non-correlation can be used for calibration of metrology tools 150. Other measurement data known by those skilled in the art having benefit of the present disclosure can be generated by the final wafer electrical test unit 630 for calibration purposes. The semiconductor wafers that were processed by the third processing tool 610 and the fourth processing tool 620 are then sent to the second metrology tool 640 for measurements, such as critical dimension measurements. Data from the second metrology tool 640 is sent via the data channel on the line 670 to the calibration algorithm unit 580. In one embodiment, the calibration algorithm unit 580 sends a new calibration back to the second metrology tool 640. In another embodiment, the calibration algorithm unit 580 will also send new calibration data to the metrology tool 150.

In one embodiment, data from the final wafer electrical test unit 630 is sent to the calibration algorithm unit 580 on a line 650. Using the methods described above, the calibration algorithm unit 580 uses data from the final wafer electrical test unit 630 to generate calibration adjustment data. The calibration adjustment data generated by the calibration unit 580 is sent to the second metrology tool 640 on a line 660. The calibration adjustment data from the line 660 is then used to perform calibration adjustments in the second metrology tool 640. In one embodiment, the multiple data transfers described by FIG. 6 are controlled by a process controller such as an APC system.

Figure 7:
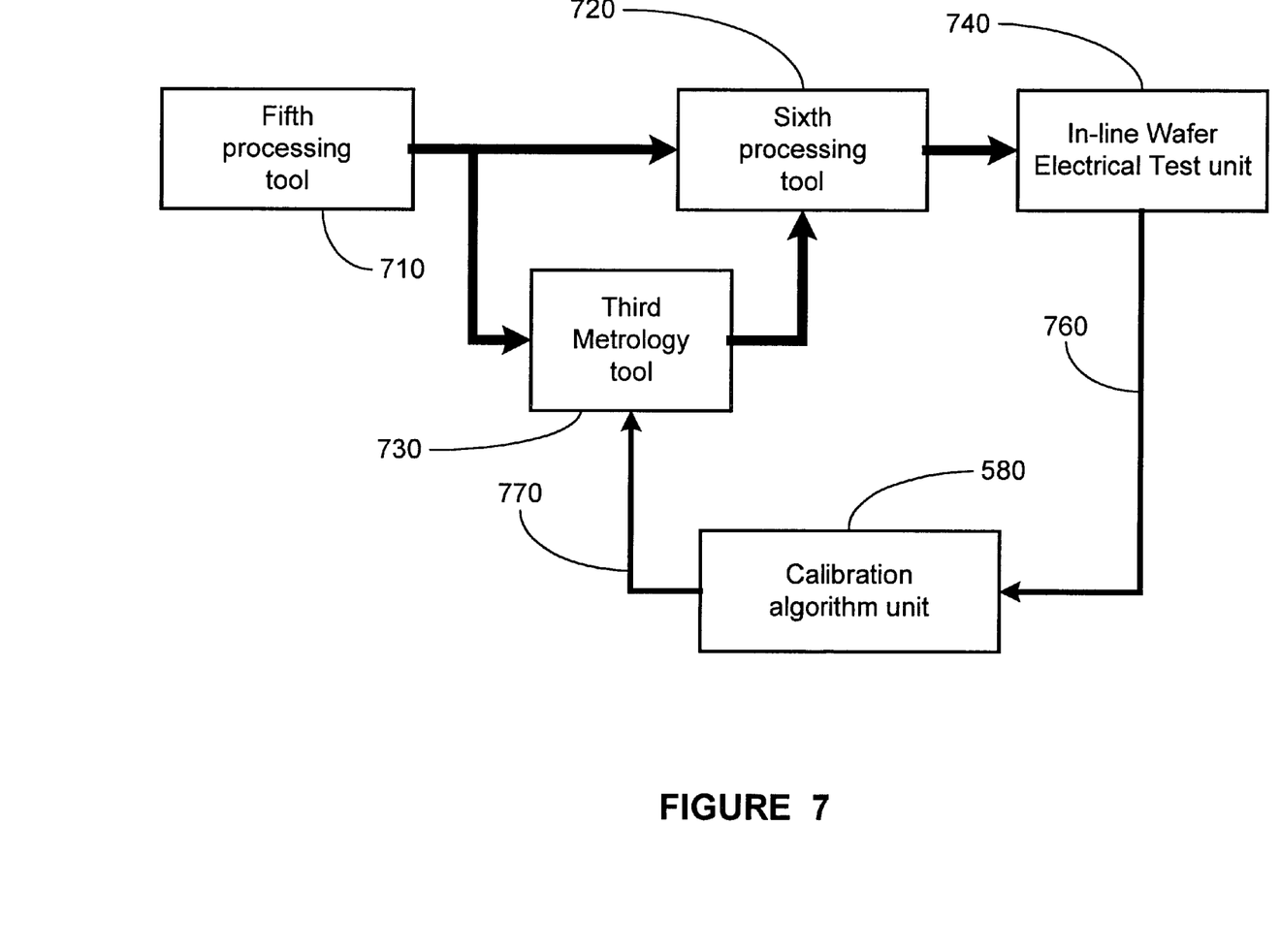
FIG. 7 illustrates a block diagram representation of a third embodiment of an apparatus for performing automated calibration of measurement tools, as taught by the present invention.

An alternative embodiment of an apparatus for performing the methods taught by the present invention is illustrated in FIG. 7. Turning now to FIG. 7, a fifth processing tool 710 processes a manufacturing run of semiconductor wafers. The processed semiconductor wafers are then further processed by a sixth processing tool 720. In one embodiment, at least a portion of the processed semiconductor wafers is analyzed using a third metrology tool 730. In one embodiment, the third metrology tool 730 is a critical dimension measurement tool. In an alternative embodiment, a non-production test wafer is circulated through the process loop illustrated in FIG. 7. Semiconductor wafers from the fifth processing tool 710 and the sixth processing tool 730 are sent to an in-line wafer electrical test unit 740 for testing.

In one embodiment, the electrical testing that is performed by the in-line wafer electrical test unit 740 includes measuring the electrical resistance corresponding to a polysilicon line in the semiconductor wafers, and other characteristics of the polysilicon line such as cross-dimensional measurements of the polysilicon line. In one embodiment, if the electrical resistance associated with a polysilicon line does not properly correlate with other measurements of the polysilicon line, data that describes the degree of the amount of the non-correlation can be used for calibration of metrology tools 150. Other measurement data known by those skilled in the art and having benefit of the present disclosure can be generated by the in-line wafer electrical test unit 740 for calibration purposes.

In one embodiment, data from the in-line wafer electrical test unit 740 is sent to the calibration algorithm unit 580 on a line 760. Using the methods described above, the calibration algorithm unit 580 uses data from the in-line wafer electrical test unit 740 to generate calibration adjustment data. The calibration adjustment data generated by the calibration algorithm unit 580 is sent to the third metrology tool 730 on a line 770. The calibration adjustment data from the line 770 is then used to perform calibration adjustments in the third metrology tool 730. In one embodiment, the multiple data transfers described by FIG. 7 are controlled by a process controller such as an APC system. The principles taught by the present invention can be implemented into other types of manufacturing frameworks.

The principles taught by the present invention can be implemented in an Advanced Process Control (APC) Framework. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for performing calibration of a critical dimension metrology, comprising:
    performing a process run of semiconductor devices;
    performing critical dimension measurements upon at least one said processed semiconductor device; and
    performing a calibration adjustment procedure upon a metrology tool using said critical dimension measurements; wherein performing said calibration adjustment procedure comprises tracking a shift in the performance of said metrology tool.

2. The method described in claim 1, wherein performing a process run of semiconductor devives further comprises semiconductor wafers.

3. The method described in claim 2, wherein processing semiconductor wafers further comprises performing a photoresist etching process on said semiconductor wafers.

4. The method described in claim 2, wherein processing semiconductor wafers further comprises performing a photolithography process on said semiconductor wafers.

5. The method described in claim 1, wherein performing critical dimension measurements further comprises performing critical dimension measurements on a polysilicon gate.

6. The method described in claim 5, wherein performing critical dimension measurements further comprises measuring a width of a polysilicon line.

7. The method described in claim 1, wherein performing a calibration adjustment procedure further comprises:
    acquiring production data;
    performing calibration measurements based upon said production data;
    performing calibration algorithm based upon said calibration measurements; and
    modifying calibration of a metrology tool based upon results of said calibration algorithm.

8. The method described in claim 7, wherein acquiring production data further comprises acquiring critical dimension measurement data.

9. The method described in claim 7, wherein performing calibration measurements further comprises performing wafer electrical tests upon said semiconductor wafers.

10. The method described in claim 7, wherein performing calibration measurements further comprises performing a cross-sectional dimensional measurement on a polysilicon line.

11. The method described in claim 10, wherein performing wafer electrical tests upon said semiconductor wafers further comprises performing electrical resistance measurements upon a polysilicon line on said semiconductor wafers.

12. The method described in claim 11, wherein performing calibration algorithm further comprises correlating said electrical resistance to said cross-sectional dimensional measurement of said polysilicon line.

13. The method described in claim 7, wherein performing calibration algorithm further comprises performing calibration algorithm using a computer software program.

14. An apparatus for performing automatic calibration of a critical dimension metrology, comprising:
    a first processing tool capable of processing at least one semiconductor wafer;
    a first metrology tool interfaced with said first processing tool, said first metrology tool being capable of acquiring production data from said processed semiconductor wafer; and
    a calibration algorithm unit interfaced with said first metrology tool, said calibration algorithm unit being capable of calibrating said first metrology tool in response to said production data; said calibrating comprising adjusting said first metrology tool based upon a shift in the performance of said first metrology tool.

15. The apparatus of claim 14, wherein said first processing tool is capable of performing photoresist etching processes upon said semiconductor wafer.

16. The apparatus of claim 14, wherein said first processing tool is capable of performing photolithography processes upon said semiconductor wafer.

17. The apparatus of claim 14, wherein said first metrology tool is a critical dimension measurement tool.

18. The apparatus of claim 14, wherein said calibration algorithm unit is capable of receiving production data and generate calibration adjustment data in response to said production data.

19. The apparatus of claim 18, wherein said calibration algorithm unit is a computer software program.

20. An apparatus for performing automatic calibration of a critical dimension metrology, comprising:
    a first processing tool capable of processing at least one semiconductor wafer;
    a first metrology tool interfaced with said first processing tool, said first metrology tool being capable of acquiring production data from said processed semiconductor wafer;
    a wafer electrical test unit capable of performing at least one electrical test upon said semiconductor wafer; and
    a calibration algorithm unit interfaced with said first metrology tool, said calibration algorithm unit being capable of calibrating said first metrology tool in response to said electrical test.

21. The apparatus of claim 20, wherein said first processing tool is capable of performing photoresist etching processes upon said semiconductor wafer.

22. The apparatus of claim 20, wherein said first processing tool is capable of performing photolithography processes upon said semiconductor wafer.

23. The apparatus of claim 20, wherein said first metrology tool is a critical dimension measurement tool.

24. The apparatus of claim 20, wherein said calibration algorithm unit is capable of receiving production data and generate calibration adjustment data in response to said production data.

25. The apparatus of claim 24, wherein said calibration algorithm unit is a computer software program.

26. The apparatus of claim 20, wherein said wafer electrical test unit is capable of performing a electrical resistance test upon a polysilicon line in said semiconductor wafer.

27. The apparatus of claim 26, wherein said wafer electrical test unit is a final wafer electrical test unit.

28. The apparatus of claim 26 wherein said wafer electrical test unit is an in-line wafer electrical test unit.

29. An apparatus for performing automatic calibration of a critical dimension metrology, comprising:
    means for performing a process run of semiconductor devices;
    means for performing critical dimension measurements upon at least one said processed semiconductor device; and
    means for performing a calibration adjustment procedure upon a metrology_tool using said critical dimension measurements; wherein performing said calibration adjustment procedure comprises tracking a shift in the performance of said metrology tool.

30. A computer readable program storage device encoded with instructions that, when executed by a computer, performs a method for performing automatic calibration of a critical dimension metrology, comprising:

performing a process run of semiconductor devices;

performing critical dimension measurements upon at least one said processed semiconductor device; and performing a calibration adjustment procedure upon a metrology tool using said critical dimension measurements; wherein performing said calibration adjustment procedure comprises tracking a shift in the performance of said metrology tool.

31. The computer readable program storage device encoded with instructions that, when executed by a computer, performs the method described in claim 1, wherein performing a process run of semiconductor devices further comprises processing semiconductor wafers.

32. The computer readable program storage device encoded with instructions that, when executed by a computer, performs the method described in claim 2, wherein processing semiconductor wafers further comprises performing a photoresist etching process on said semiconductor wafers.

33. The computer readable program storage device encoded with instructions that, when executed by a computer, performs the method described in claim 2, wherein processing semiconductor wafers further comprises performing a photolithography process on said semiconductor wafers.

34. The computer readable program storage device encoded with instructions that, when executed by a computer, performs the method described in claim 1, wherein performing critical dimension measurements further comprises performing critical dimension measurements on a polysilicon gate.

35. The computer readable program storage device encoded with instructions that, when executed by a computer, performs the method described in claim 5, wherein performing critical dimension measurements further comprises measuring a width of a polysilicon line.

36. The computer readable program storage device encoded with instructions that, when executed by a computer, performs the method described in claim 1, wherein performing a calibration adjustment procedure further comprises:

acquiring production data;

performing calibration measurements based upon said production data;

performing calibration algorithm based upon said calibration measurements; and modifying calibration of a metrology tool based upon results of said calibration algorithm.

37. The computer readable program storage device encoded with instructions that, when executed by a computer, performs the method described in claim 7, wherein acquiring production data further comprises acquiring critical dimension measurement data.

38. The computer readable program storage device encoded with instructions that, when executed by a computer, performs the method described in claim 7, wherein performing calibration measurements further comprises performing wafer electrical tests upon said semiconductor wafers.

39. The computer readable program storage device encoded with instructions that, when executed by a computer, performs the method described in claim 7, wherein performing calibration measurements further comprises performing a cross-sectional dimensional measurement on a polysilicon line.

40. The computer readable program storage device encoded with instructions that, when executed by a computer, performs the method described in claim 10, wherein performing wafer electrical tests upon said semiconductor wafers further comprises performing electrical resistance measurements upon a polysilicon line on said semiconductor wafers.

41. The computer readable program storage device encoded with instructions that, when executed by a computer, performs the method described in claim 11, wherein performing calibration algorithm further comprises correlating said electrical resistance to said crosssectional dimensional measurement of said polysilicon line.

* * * * *

UNITED STATES PATENT AND TRADEMARK OFFICE
CERTIFICATE OF CORRECTION

PATENT NO. : 6,532,428 B1
DATED : March 11, 2003
INVENTOR(S) : Anthony J. Toprac It is certified that error appears in the above-identified patent and that said Letters Patent is hereby corrected as shown below:

Column 11,
Line 17, replace "devives" with -- devices --.
Lines 17-18, insert -- processing -- after "comprises" and before "semiconductor".

Column 14,
Line 39, replace "crosssectional" with -- cross-sectional --.

Signed and Sealed this

Ninth Day of September, 2003

JAMES E. ROGAN
*Director of the United States Patent and Trademark Office*